United States Patent
Blakely

(10) Patent No.: US 7,965,086 B2
(45) Date of Patent: Jun. 21, 2011

(54) DIFFERENTIAL-MODE CURRENT SENSOR METHOD

(75) Inventor: John Herman Blakely, Weaverville, NC (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 12/786,312

(22) Filed: May 24, 2010

(65) Prior Publication Data

US 2010/0271038 A1 Oct. 28, 2010

Related U.S. Application Data

(62) Division of application No. 11/864,495, filed on Sep. 28, 2007, now Pat. No. 7,741,853.

(51) Int. Cl.
*G01R 31/14* (2006.01)

(52) U.S. Cl. ........................................ 324/509; 324/536

(58) Field of Classification Search .................. 324/509, 324/536

See application file for complete search history.

(56) References Cited

U.S. PATENT DOCUMENTS

| | | | | |
|---|---|---|---|---|
| 3,763,482 | A | * | 10/1973 | Burney et al. .................. 340/564 |
| 3,996,513 | A | | 12/1976 | Butler |
| 5,341,281 | A | | 8/1994 | Skibinski |
| 5,446,446 | A | | 8/1995 | Harman |
| 5,825,190 | A | | 10/1998 | Van Der Laan et al. |
| 7,615,988 | B2 | | 11/2009 | Blakely |

* cited by examiner

*Primary Examiner* — Vincent Q Nguyen

(74) *Attorney, Agent, or Firm* — Fletcher Yoder LLP; William R. Walbrun; John M. Miller

(57) ABSTRACT

Systems, methods, and devices are disclosed, including a ground-fault sensor that has a plurality of conductors each disposed one inside of another except for an outer conductor and a field sensor configured to sense an electric field, a magnetic field, or both. In some embodiments, the field sensor is disposed adjacent the outer conductor.

20 Claims, 4 Drawing Sheets

DIFFERENTIAL-MODE CURRENT SENSOR METHOD

CROSS-REFERENCE TO RELATED APPLICATIONS

This application is a divisional of application Ser. No. 11/864,495, filed Sep. 27, 2007, now U.S. Pat. No. 7,741,853, entitled "DIFFERENTIAL-MODE-CURRENT-SENSING METHOD AND APPARATUS" in the name of John Herman Blakely.

BACKGROUND

The invention relates generally to electrical devices and, more specifically, in certain embodiments, to ground-fault sensors.

A variety of electrical systems monitor ground faults with a ground-fault sensor. Typically, these sensors detect currents between the electrical system and ground, as might occur when the electrical system charges some object outside the system. For instance, ground currents might occur as a frayed wire contacts an electrical conductor outside of the electrical system. In the event that current flows to or from ground, it is useful to detect the ground fault, so electrical power can be removed from the system before the ground current damages the electrical system or other devices.

To identify a ground current, some ground-fault sensors detect electromagnetic fields that arise during a ground fault. A ground fault typically produces a net current flow to, or from, one side of a circuit, as electrons leave or enter the system via the ground fault. This is referred to as a differential-mode current. Differential-mode currents are distinguished from common-mode currents, which occur during normal operation as the electrons that flow in one side of the circuit are balanced by electrons that flow out the other side. A typical result of a differential-mode current is a detectable electromagnetic signature. The signature, however, can be difficult for conventional ground-fault sensors to detect, because the electromagnetic fields produced by normal, common-mode currents can create noise that is difficult to distinguish from the signature of a differential-mode current.

Another issue with conventional ground fault sensing techniques resides in the mechanisms used to detect unbalanced current flow by monitoring fields surrounding conductors. For example, ground faults in three-phase systems can be detected by passing three phase conductors through a common toroidal current sensing coil. The positions of the conductors, however, are rarely the same, leading to slight, but detectable imbalances in the magnetic flux that induces the measured current in the sensing coil. Devices, such as iron rings, can be used in conjunction with such arrangements to help spread or distribute the flux, but are not fully effective at eliminating the effect.

There is a need, therefore, for improved methods and arrangements for detecting ground faults. There is a particular need for an arrangement that can be used in connection with three-phase electrical equipment.

BRIEF DESCRIPTION

The invention provides a technique for sensing ground faults designed to respond to such issues. The technique may be used in a wide range of settings, and is particularly well suited to industrial and commercial three-phase equipment. In accordance with certain aspects of the new technique, a ground fault sensing assembly includes a set of co-axial conductors for three phases of power. The assembly may also include a transformer disposed adjacent to the outer conductor in the set. Other components may be associated with these to enhance the functionality of the assembly, particularly for ground fault sensing.

The technique also provides a differential mode current sensor and method for sensing ground faults.

DRAWINGS

Various features, aspects, and advantages of the present invention will become better understood when the following detailed description is read with reference to the accompanying drawings in which like characters represent like parts throughout the drawings, wherein.

DETAILED DESCRIPTION

Figure 1:
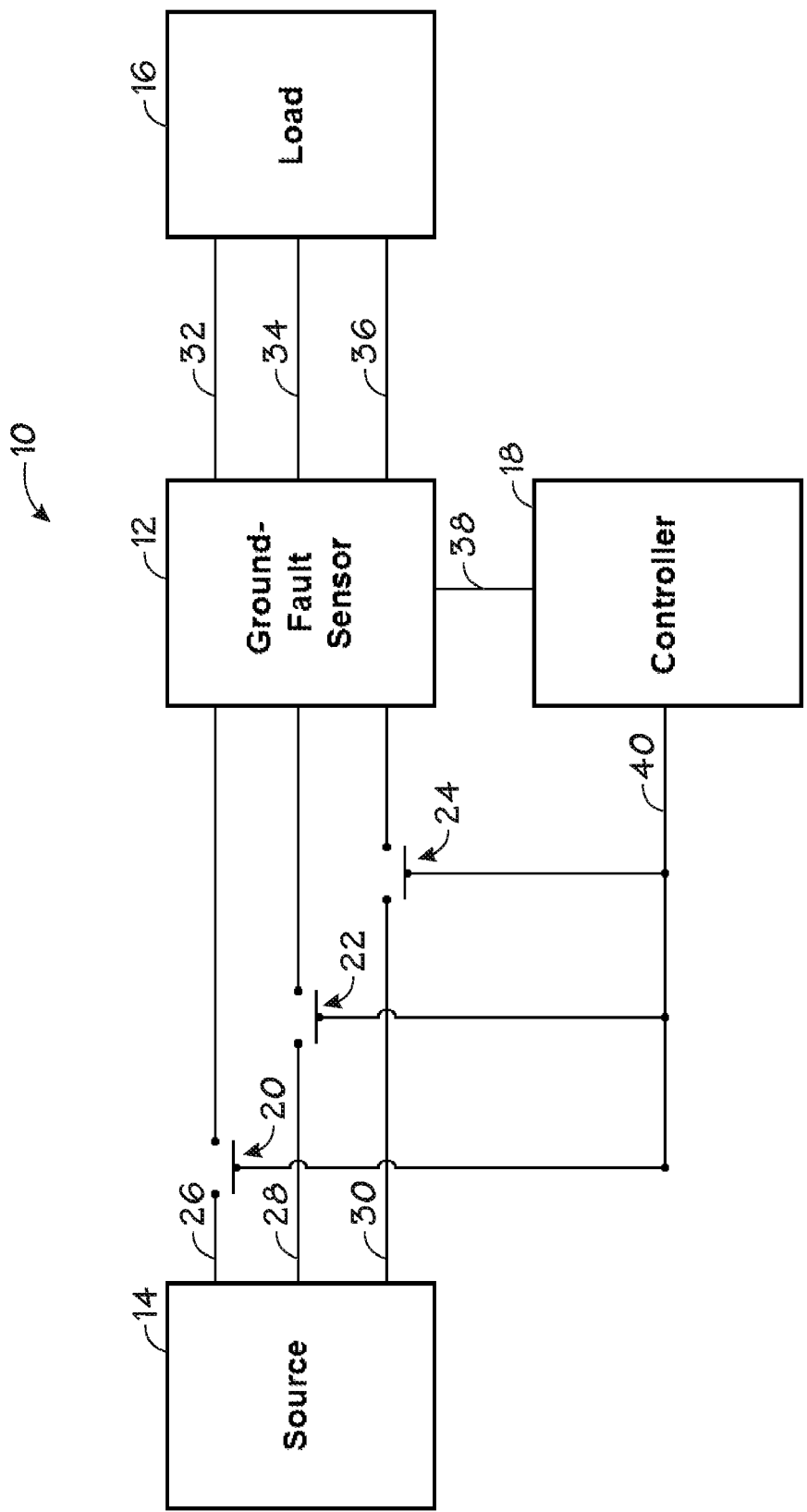
FIG. 1 illustrates an example of an electrical system in accordance with an embodiment of the present technique.

FIG. 1 illustrates an electrical system 10 having a ground-fault sensor 12 that may address one or more of the problems described above. In some subsequently described embodiments, the ground fault sensor 12 includes conductors arranged such that electromagnetic fields from common-mode currents substantially cancel one another in certain regions. By sensing electromagnetic fields in these regions, the illustrated ground-fault sensor 12 detects relatively small electromagnetic fields from small differential-mode currents despite conducting relatively large common-mode currents. The ground-fault sensor 12 is described in detail below, after describing an exemplary electrical system 10 in which it may be used.

The presently described electrical system 10 includes a source 14, a load 16, a controller 18, and contactors 20, 22, and 24. The illustrated source 14 is a three-phase, alternating current (AC) electrical power source. In some embodiments, the source 14 may include or couple to grid power or a generator configured to deliver three phases of AC power. In other embodiments, the source 14 may output a different number of phases of AC power, e.g., two-phase AC power, or four-phase AC power. Further, other embodiments may include a source 14 configured to output direct current (DC) power.

The load 16 may be a variety of types of electrical devices. For example, the load 20 may be a synchronous AC motor, a stepper motor, and induction motor, a linear motor, or the like. These motors or other devices may be coupled to a variety of machines, such as a conveyor belt, a pump, a fan, a drive shaft, or a wheel, for instance. Alternatively, or additionally, the load 16 may include other types of electrical devices, such as a heating element, and inductive heating winding, an amplifier, an electrolysis bath, an energy storage device, a battery, or a capacitor.

The illustrated load 16 is connected to the source 14 via the ground-fault sensor 12 and several phase paths. In this example, the source 14 is connected to the ground-fault sensor 12 by three source-side phase paths 26, 28, and 30. Similarly, the load 16 is connected to the ground-fault sensor 12 by three load-side phase paths 32, 34, and 36. Other embodiments may include more or fewer phase paths, depending on the number of phases or nature of the electrical power, e.g., AC or DC.

In this embodiment, the ground-fault sensor 12 is further connected via a ground-current-signal path 38 to the controller 18. The controller 18 may be configured to control contactors 20, 22, and 24 disposed on the phase paths 26, 28, and 30, respectively. As explained below, the controller may be adapted to control the contactors 20, 22, and 24 based on a ground-current signal conveyed by the ground-current-signal path 38. In some embodiments, the controller 18 may include a variety of analog or digital circuits, such as a microprocessor, a central processing unit (CPU), and application-specific integrated circuit (ASIC), a digital signal processor (DSP), a microcontroller, or the like. An output of the controller 18 is connected to the contactors 20, 22, and 24 by a control-signal path 40 that carries a control signal adapted to open or close the contactors 20, 22, and 24.

In operation, the source 14 drives the load 16 by transmitting three phases of electrical power through the source-side phase paths 26, 28, and 30, the ground-fault sensor 12, and the load-side phase paths 32, 34, and 36. In some embodiments, the phases are generally sinusoidal, and each of the phases is generally identical to the other phases except that they are phase shifted by 120 degrees relative to one another. The current between the source 14 and the load 16 may vary depending on the application, but in various embodiments, this current may range from 20 amps in a residential circuit to 1000, 3000, or 5000 amps or greater in industrial systems.

As the source 14 powers the load 16, in this embodiment, the ground-fault sensor 12 monitors the electrical system 10 for currents between the electrical system 10 and ground. To this end, the ground-fault sensor 12 may determine whether the aggregate of the currents flowing toward the load 16 is generally equal to the aggregate of the currents flowing from the load 16, i.e., whether a differential-mode current is flowing between the source 14 and the load 16. If the ground-fault sensor 12 senses a difference, it transmits a ground-current signal on the ground-current-signal path 38 that is indicative of the difference. For example, the ground-fault sensor 12 may signal both the direction of the differential-mode current and the magnitude of the differential-mode current. Details of an example of a ground-fault detector are described below with reference to FIG. 2.

The controller 18 monitors the ground-current signal. In some embodiments, the controller 18 determines whether the ground-current signal is greater than a threshold value and, in response to the ground-signal exceeding the threshold, transmits a control signal on the control-signal path 40 to open the contactors 20, 22, and 24. Additionally, or alternatively, in some embodiments, the controller 18 integrates the ground-current signal with respect to time and opens the contactors 20, 22, 24 if the integral is greater than a threshold value. Further examples of functions of the controller 18 are described below with reference to FIG. 4.

Figure 2:
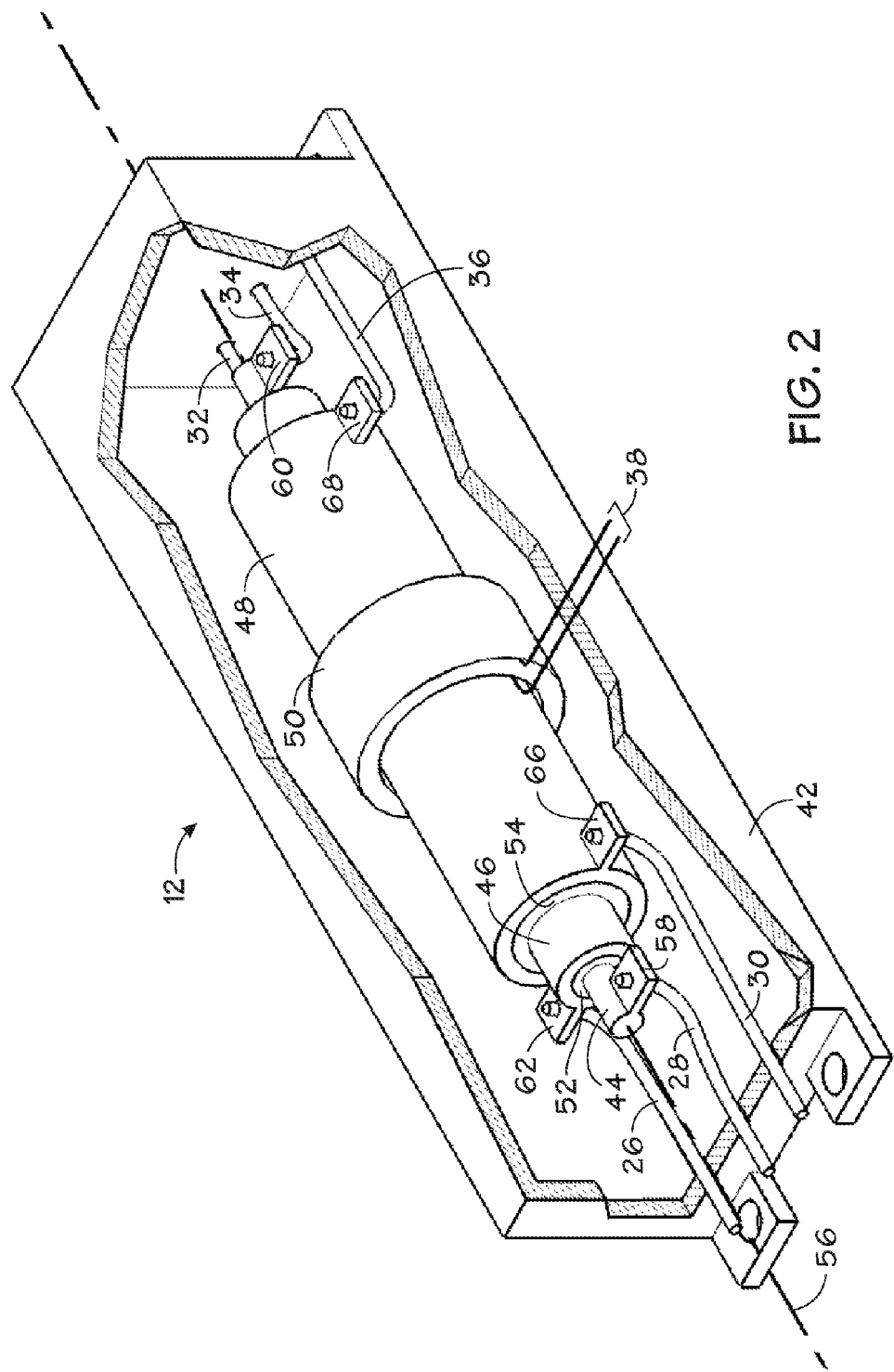
FIG. 2 illustrates an example of a ground-fault sensor in accordance with an embodiment of the present technique.

FIG. 2 illustrates an example of the ground-fault sensor 12. In this embodiment, the ground-fault sensor 12 includes a housing 42, an inner conductor 44, a middle conductor 46, an outer conductor 48, and a transformer 50. The illustrated inner conductor 44 is isolated from the middle conductor 46 by an inner insulator 52, and the middle conductor 46 is isolated from the outer conductor 48 by an outer insulator 54. As explained below, each of the conductors 44, 46, and 48 and the insulators 52 and 54 is generally concentric about a central axis 56, and this geometry is believed to reduce the effect of common-mode currents on the transformer 50, thereby enhancing the sensitivity of the transformer 50 to differential-mode currents.

The illustrated housing 42 defines a generally cuboid volume, though other embodiments may define other volumes with other shapes, and is made of a conductive material, such as steel. In some embodiments, the housing 42 substantially or completely envelops both the conductors 44, 46, and 48 and the transformer 52 to shield these components. The housing 42 is penetrated by the source-side phase paths 26, 28, and 30, the ground-current signal path 38, and the load-side phase paths 32, 34, and 36.

The conductors 44, 46, and 48 each connect to both the source 14 and the load 16 through connectors. In this embodiment, the inner conductor 44 includes connectors 58 and 60 that connect the inner conductor 44 in series between the source-side phase path 28 and the load-side phase path 34. The middle conductor 46 includes connectors 62 and 64 (not shown in the perspective of FIG. 2) that connect the middle conductor 46 in series between the source-side phase path 26 and the load-side phase path 32. The outer conductor 48 includes connectors 66 and 68 that connect the outer conductor 48 in series between the source-side phase path 30 and the load-side phase path 36. In the illustrated embodiment, the inner conductor 44 is longer than the middle conductor 46, and the middle conductor 46 is longer than the outer conductor 48, so the ends of the conductors 44 and 46 are exposed.

The illustrated transformer 50 includes a winding that terminates with two leads. These leads form the ground-current signal path 38. In some embodiments, one lead may be grounded, and the other lead may constitute the ground-current signal path 38. The transformer 50 is generally concentric about the central axis 56 and is disposed about the outer conductor 48 generally midway along the length of the outer conductor 48. The winding in the transformer 50 may be wrapped around the outer conductor 48. The transformer 50 may be spaced away from the end of the outer conductor 48 by an appropriate distance to avoid electromagnetic-field edge effects, for example two or three feet on either side. Alternatively, or additionally, the housing 42 may include interior, conductive walls or other structures that shield either side of the transformer 50 from the ends of the conductors 48, 46, and 44.

The housing 42 may be filled with a potting material that electrically isolates the components inside the housing 42 from both one another and the housing 42. Although it is not shown in FIG. 2, potting material 70 is depicted in FIG. 3, which is a cross-section of the ground-fault sensor 12 perpendicular to the central axis 56.

Figure 3:
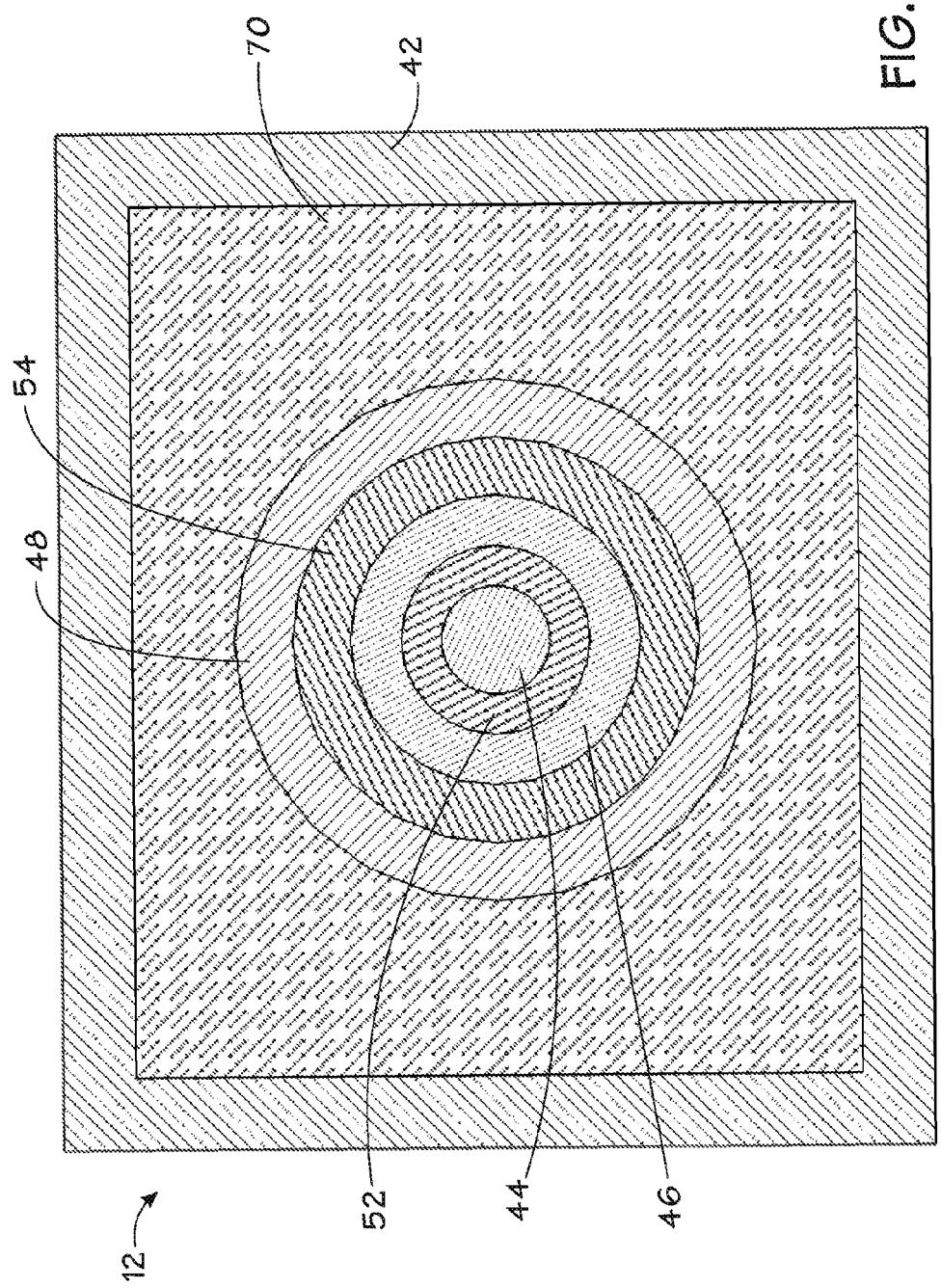
FIG. 3 illustrates a cross-section of the ground-fault sensor of FIG. 2.

As illustrated by FIG. 3, the conductors 48, 46, and 44 are generally coaxial, generally circular, generally rotationally symmetric, and generally concentric about the central axis 56. Further, both the middle conductor 46 and the inner conductor 44 are substantially or entirely surrounded by the outer conductor 48 along a substantial portion of their length, and the inner conductor 44 is substantially or entirely surrounded by the middle conductor 46 along a substantial portion of the length of the inner conductor 44. In this embodiment, the inner conductor 44 has a generally right-circular-cylindrical shape, but in other embodiments, it may have a tubular shape with a hollow or filled interior. Both the middle conductor 46 and the outer conductor 48, in this embodiment, have generally tubular shapes. The conductors 48 may be made from a variety of conductive materials, such as copper or aluminum. Several sizes of conductors 44, 46, and 48 are contemplated, including those in the following table (the number of significant digits of dimensions herein are not intended to indicate that terms "approximately," "generally," "substantially," and the like define a particular range):

TABLE 1

| Example | Inner Conductor | Middle Conductor | Outer Conductor |
|---|---|---|---|
| 1 | ½" Copper Pipe | 1" Copper Pipe | 1.5" Copper Pipe |
| 2 | 0.625" Sold Copper Rod | 1" Copper Pipe | 1.5" Copper Pipe |

The insulators 52 and 54 are shaped both to insulate the conductors 44, 46, and 48 from one another and to position the conductors 44, 46, and 48 such that they are generally concentric about, and generally parallel to, the central axis 56. The insulators 52 and 54 may be made from an appropriate insulator, such as nylon, other plastics, or a ceramic, and in some embodiments, a portion or all of the space between the conductors 44, 46, and 48 may be an air gap or may be filled with some other dielectric fluid. In certain embodiments, the insulators 52 and 54 have a generally tubular shape that is concentric about the central axis 56, and their dimensions may generally correspond to the dimensions of the adjacent sides of the conductors 44, 46, and 48.

In operation, the ground-fault sensor 12 senses differential-mode currents. As explained above, these currents arise when current flows between the electrical system 10 and ground. The differential-mode current emits an electromagnetic field around the conductors 44, 46, and 48, and this field induces a potential across, or current through, the transformer 50. As a result, the voltage or current of the ground-current signal on the ground-current-signal path 38 corresponds, e.g., proportionally, to both the direction and the magnitude of the differential-mode current. Thus, during a ground fault, the onset of a differential-mode current is sensed by the ground-fault sensor 12 and is signaled on the ground-current-signal path 38.

A benefit of the present embodiment is that the ground-fault sensor 12 is largely unaffected by electromagnetic fields from common-mode currents. The fields emitted by each of the conductors 44, 46, and 48 from common-mode currents are believed to cancel each other in the region around the outer conductor 48. That is, in the location of the transformer 50, the sum of the field vectors for each of the conductors 44, 46, and 48 is approximately zero when the conductors 44, 46, and 48 carry only common-mode currents. As a result, common-mode currents generally do not induce a current through, or potential across, the transformer 50, and the ground-current signal is substantially free from noise caused by common-mode currents. In contrast, many conventional ground-fault sensors do not have a common-phase-conductor axis, and the field vectors around these sensors do not sum to zero.

The degree to which the ground-fault sensor 12 is unaffected by common-mode currents may be quantified by a parameter referred to as the common-mode rejection ratio (CMRR). The CMRR may be calculated in decibels according to the following equation (Equation 1), in which $I_{CM\text{-}AVG\text{-}RMS}$ represents the average root-mean-square (RMS) value of the three common-mode phase currents, and $I_{DM\text{-}NOISE}$ represents the differential-mode current perceived by the ground-fault sensor when there are no differential-mode currents and the ground-fault sensor is conducting the three common-mode phase currents:

$$CMRR = 20 * \mathrm{Log}(I_{CM\text{-}AVG\text{-}RMS}/I_{DM\text{-}NOISE}) \quad \text{Equation 1}$$

In some embodiments, the ground-fault sensor 12 has a common-mode rejection ratio greater than or equal to 100 dB, 114 dB, 120 dB, or 127 dB.

Eliminating or reducing noise from common-mode currents is believed to facilitate the rapid identification of relatively small differential-mode currents. Because the ground-current signal is generally unaffected by common-mode currents, the controller 18 quickly identifies relatively small changes in the ground-current signal as indicating a ground-fault. In some embodiments, the ground-fault sensor 12 is configured to detect a ground current of less than or equal to 20 milliamps to or from an electrical system 10 carrying 5000 amps of common-mode current.

A benefit of this sensitivity is that the controller 18 may be configured to respond to relatively small ground currents by asserting a control signal on the control signal path 40. As a result, the controller 18 may open the contactors 20, 22, and 24 early in the onset of a ground fault, before the electrical system 10 or other devices are damaged. Further, for a given threshold voltage of the ground-current signal, the electrical system 10 is believed to exhibit relatively few false-positive identifications of a ground fault as compared to a conventional system.

In other embodiments, other types of devices made sense the differential-mode currents. For example, in some DC systems, a Hall-effect transducer may be in or near the position of the transformer 52, and the Hall-effect transducer may sense fields from the differential-mode currents.

Further, other embodiments may sense differential-mode currents among more than three phases. In these higher-phase-number embodiments, the ground-fault sensor 12 may have additional layers of insulators and conductors concentrically disposed around the outer conductor 48, e.g., the additional conductors and insulators may be coaxial with the outer conductor 48. For instance, a four-phase system may have an additional coaxial conductor disposed around the outer conductor 48 and within the transformer 50, and an n-phase system may have n layers of coaxial conductors disposed within the transformer 50.

In some embodiments, one or more of the conductors 44, 46, and 48 may have a non-circular shape, such as an elliptical shape, a square shape, a polygon shape, or some other shape. In some of these non-circular embodiments, the shapes may be configured such that electric fields from common-mode currents cancel in some region, and the transformer 50 or some other field sensor may be positioned in this region.

Figure 4:
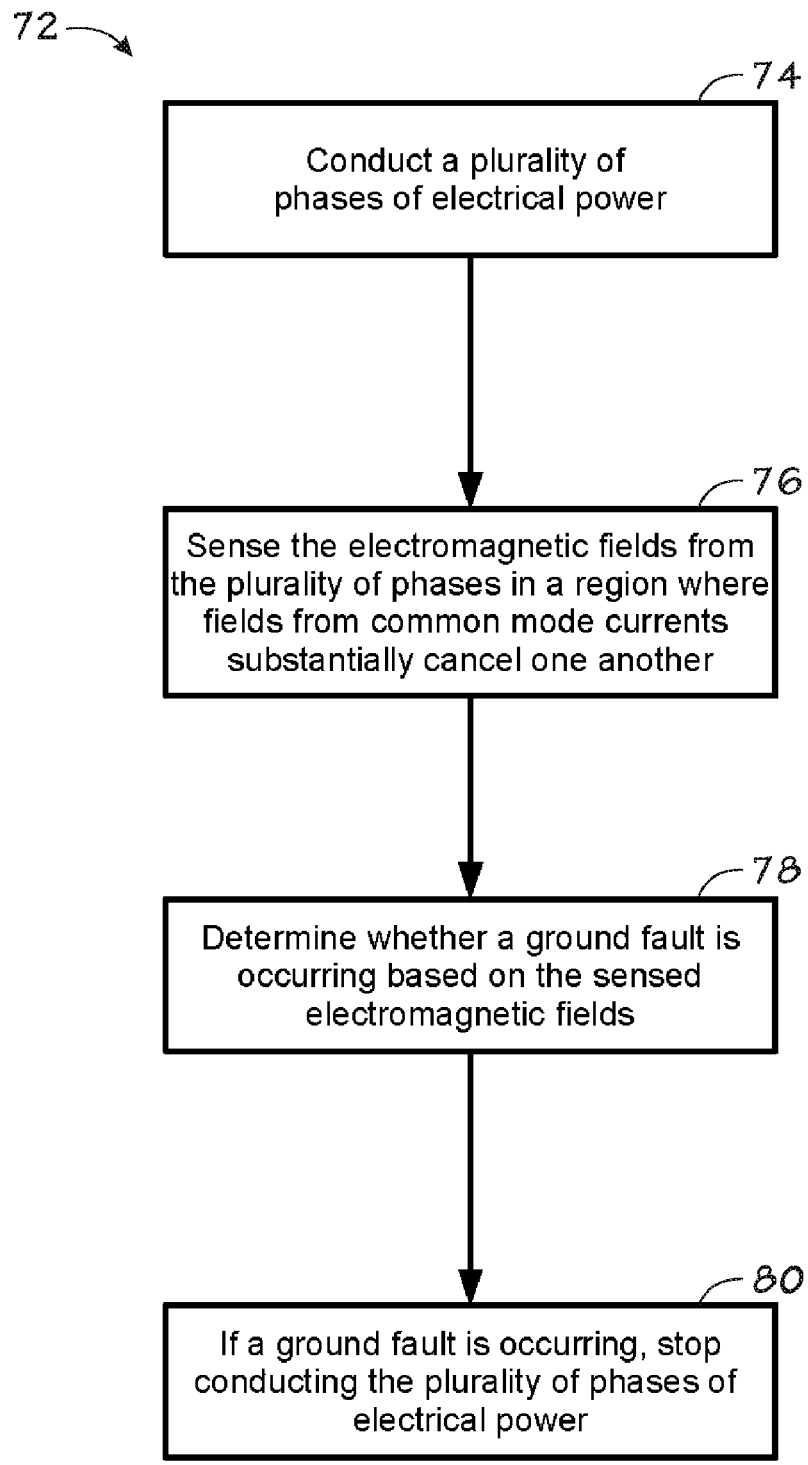
FIG. 4 illustrates an example of a ground-fault-sensing process in accordance with an embodiment of the present technique.

FIG. 4 illustrates an example of a ground-fault-sensing process 72. The illustrated process 72 includes conducting a plurality of phases of electrical power, as illustrated by block 74. This may include conducting three phases of sinusoidal AC power, and the power may be conducted between a source and a load.

The process 72 further includes sensing electromagnetic fields from the plurality of phases in a region where fields from common-mode currents substantially cancel one another, as illustrated by block 76. This act may include passing the fields through a field sensor configured to sense electromagnetic fields, such as a transformer or a Hall-effect transducer. The field sensor may be disposed around the exterior of three or more coaxial conductors that conduct the plurality of phases.

In this embodiment, the process 72 includes determining whether a ground fault is occurring based on the sensed electromagnetic field, as illustrated by block 78. Determining whether a ground fault is occurring may include receiving a signal indicative of a direction, magnitude, or both, of a differential-mode current and comparing the received signal to a threshold value, such as a threshold voltage or current. In some embodiments, the received signal may be integrated over time, and the integral may be compared to another threshold value to identify smaller, persistent ground faults. Comparing may include determining whether the signal or integral is greater than the threshold value, less than the threshold value, or both.

Finally, the process 72 includes stopping conducting the plurality of phases of electrical power if a ground fault is occurring, as illustrated by block 80. Stopping conducting the plurality of phases may include transmitting a control signal to contactors and opening the contactors, signaling a source to cease delivering power, signaling a load to cease operating, or signaling an operator to take action. In some embodiments, a signal indicative of the presence, magnitude, or direction of a differential-mode current may be sent to a display or alarm, or data indicative of a ground-fault may be stored in a tangible, machine-readable memory.

Because the process 72 senses electromagnetic fields in a region that is generally free from the effects of common-mode currents, the process 72 is believed to be relatively sensitive to differential-mode currents. As a result, relative to conventional systems, the process 72 may determine that a ground fault is occurring when the sensed electromagnetic fields are small without triggering an inordinate number of false positives.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A differential-mode current sensing method, comprising:
   conducting a plurality of phases of electrical power through first, second, and third phase conductors disposed coaxially about one another along a longitudinal axis; and
   sensing an electromagnetic field from the plurality of phases in a region outside of the conductors in which electromagnetic fields from common-mode currents substantially cancel one another.

2. The method of claim 1, wherein conducting a plurality of phases of electrical power comprises conducting three or more phases of generally sinusoidal electrical power.

3. The method of claim 1, wherein conducting a plurality of phases of electrical power comprises:
   conducting a first phase through an inner conductor;
   conducting a second phase through a middle conductor disposed around the inner conductor; and
   conducting a third phase through an outer conductor disposed around the middle conductor.

4. The method of claim 1, wherein sensing electromagnetic field comprises inducing a potential in a transformer.

5. The method of claim 1, wherein the electromagnetic field is sensed by a Hall-effect transducer.

6. The method of claim 1, comprising detecting a ground-fault based on the sensed electromagnetic field.

7. The method of claim 1, wherein the conductors extend through a field sensor that senses the electromagnetic field.

8. The method of claim 1, insulators are disposed between coaxial pairs of the conductors.

9. The method of claim 1, wherein a sensor for sensing the electromagnetic field has a common-mode rejection ratio greater than or equal to 110 dB.

10. The method of claim 1, further comprising transmitting a signal representative of the sensed electromagnetic field to a control circuit.

11. The method of claim 10, wherein the ground fault by detected by determining whether a signal generated by sensing the electromagnetic field is greater than a threshold value, less than a threshold value, or both.

12. The method of claim 1, comprising integrating a signal generated by sensing the electromagnetic field.

13. The method of claim 1, further comprising opening a current path coupled to the conductors based upon the sensed electromagnetic field.

14. A differential-mode current sensing method, comprising:
   conducting a plurality of phases of electrical power through first, second, and third phase conductors disposed coaxially about one another along a longitudinal axis;
   sensing an electromagnetic field from the plurality of phases in a region outside of the conductors in which electromagnetic fields from common-mode currents substantially cancel one another; and
   determining whether a ground fault exists based upon the sensed electromagnetic field.

15. The method of claim 14, wherein the ground fault by detected by determining whether a signal generated by sensing the electromagnetic field is greater than a threshold value, less than a threshold value, or both.

16. The method of claim 14, comprising integrating a signal generated by sensing the electromagnetic field.

17. The method of claim 14, further comprising opening a current path coupled to the conductors based upon the sensed electromagnetic field.

18. A differential-mode current sensing method, comprising:
   conducting a plurality of phases of electrical power through first, second, and third phase conductors disposed coaxially about one another along a longitudinal axis;
   sensing an electromagnetic field from the plurality of phases in a region outside of the conductors in which electromagnetic fields from common-mode currents substantially cancel one another;
   transmitting a signal representative of the sensed electromagnetic field to a control circuit;
   determining in the control circuit whether a ground fault exists based upon the sensed electromagnetic field; and
   commanding via the control circuit opening of a current path if a ground fault is detected.

19. The method of claim 18, wherein the ground fault by detected by determining whether a signal generated by sensing the electromagnetic field is greater than a threshold value, less than a threshold value, or both.

20. The method of claim 18, comprising integrating a signal generated by sensing the electromagnetic field.

* * * * *